United States Patent [19]
Bloch et al.

[11] Patent Number: 5,385,289
[45] Date of Patent: Jan. 31, 1995

[54] EMBEDDED FEATURES FOR REGISTRATION MEASUREMENT IN ELECTRONICS MANUFACTURING

[75] Inventors: Carl J. Bloch, Wayland; Philip E. McKinley, Westford, both of Mass.; Ramaswamy Ranganathan, Cupertino, Calif.

[73] Assignee: Digital Equipment Corporation, Maynard, Mass.

[21] Appl. No.: 193,309

[22] Filed: Feb. 8, 1994

[51] Int. Cl.⁶ .............................................. H05K 3/34
[52] U.S. Cl. ..................................... 228/103; 228/105; 228/248.1; 356/401
[58] Field of Search ................... 228/103, 105, 180.22, 228/248.1, 6.2, 49.5, 56.5; 356/399, 401

[56] References Cited
U.S. PATENT DOCUMENTS

| | | | |
|---|---|---|---|
| 3,796,497 | 3/1974 | Mathisen et al. | 356/152 |
| 4,005,939 | 2/1977 | Stavalone | 356/165 |
| 4,291,334 | 9/1981 | Mese et al. | 358/101 |
| 4,463,310 | 7/1984 | Whitley | 324/73 PC |
| 4,542,439 | 9/1985 | Dick | 257/786 |
| 4,655,600 | 4/1987 | Tanigawa | 356/401 |
| 4,985,107 | 1/1991 | Conroy et al. | 156/299 |
| 5,017,514 | 5/1991 | Nishimoto | 437/229 |
| 5,153,678 | 10/1992 | Ota | 356/401 |
| 5,195,279 | 3/1993 | Wern | 51/415 |
| 5,262,594 | 11/1993 | Edwin et al. | 174/254 |
| 5,296,649 | 3/1994 | Kosuga et al. | 228/180.1 |

*Primary Examiner*—Samuel M. Heinrich

[57] ABSTRACT

Etch features are included on a printed circuit (PC) board to be used in monitoring and controlling assembly processes such as soldering. A vernier pattern of etch blocks receives corresponding solder blocks during solder paste screening; misalignment of the solder stencil to the PC board is indicated by an easily-seen interference pattern of spaces created by the superimposed etch and solder blocks. The degree of misalignment can be determined by measuring the distance between the center of the interference pattern and a reference etch block. Also, a scale pattern of etch receives a bar of solder paste; misalignment in the direction orthogonal to the long axis of the scale is indicated by the location of the intersection of the long axis and the solder bar.

22 Claims, 5 Drawing Sheets

EMBEDDED FEATURES FOR REGISTRATION MEASUREMENT IN ELECTRONICS MANUFACTURING

FIELD OF THE INVENTION

The invention is related to the field of electronics manufacturing, and more specifically to methods of measuring, monitoring and controlling the accuracy of processes used to fabricate circuit substrates, such as printed circuit boards, processes used to fabricate integrated circuits, and processes used to manufacture electronic assemblies.

BACKGROUND OF THE INVENTION

In the field of electronics manufacturing, it is often necessary to determine the relative alignment or registration between objects or patterns. The registration process typically involves several cooperating functions including the following:

1) Calibration. Calibration defines what is considered correct registration to the process which effects the alignment of two objects.

2) Active Registration Control. The alignment process performs successive adjustments to the relative alignment of two objects by measuring the relative alignment of two fiducial patterns.

3) Process Monitoring: A measurement of mis-registration of two objects with an appropriate sampling plan to detect drift, erratic or out of specification registration.

An exemplary registration process is one involving a machine that prints a pattern upon a printed circuit board. The printing machine requires calibration to ensure that the pattern is printed in the correct location. This calibration takes the form of printing a pattern, measuring the horizontal and vertical offsets of the printed pattern relative to the ideal location, and then adjusting the printing machine to correct for these offsets.

The ability to accurately measure the degree of mis-registration also supports process control and inspection. The registration process is fundamental to several electronics manufacturing applications including but not limited to the following:

1. Alignment of layers of a multi-layer substrate structure such as printed wiring boards, hybrid circuits, flex circuits, multi-chip modules, chip carriers, etc;
2. Alignment of solder paste to corresponding pads;
3. Alignment of successive layers of semiconductor integrated circuit devices;
4. Alignment of solder paste onto substrate;
5. Alignment of solder mask and nomenclature patterns onto printed wiring board; and
6. Alignment of successively printed layers on thick film circuits.

In the process monitoring context, registration detection schemes provide valuable feedback about the accuracy of process steps. For example, the manufacture of electronics assemblies can require that material deposited on the workpiece during a given manufacturing step be precisely aligned with previously-deposited material or with specific patterns on the workpiece. A common example is the alignment of a material referred to as "solder paste" with etch located on a surface of a PC board in preparation for the step of soldering components thereto. During a conventional soldering process, a solder stencil is placed over a component-connection surface of a PC board. The solder stencil has numerous openings corresponding to locations where solder paste is to be placed, such as contact pads that will subsequently receive component leads. After the solder stencil has been placed, solder paste is deposited over it, which results in the paste being "screened" onto the PC board. Then the solder stencil is removed, leaving the PC board with numerous blocks of solder paste on its surface.

Once the solder paste has been screened onto the board, the components are then placed on the board. Ideally, the solder paste blocks are all perfectly aligned with the component connection pads, and each component lead is slightly embedded in its corresponding solder paste block. However, inaccuracies in the solder paste screening process may cause the solder paste blocks to be misaligned with the pads. If this misalignment is beyond an acceptable limit, the likelihood that the assembly process results in defective or low-quality circuits increases, resulting in corresponding increases in test and repair costs. Therefore, monitoring and control of the solder paste deposition step is important to achieving good electronic assembly yields. Ideally, of course, such monitoring should be done as quickly and accurately as possible, so that effective monitoring is obtained at a minimum cost.

SUMMARY OF THE INVENTION

The purpose of this invention is to provide beneficial feature patterns embedded into or onto the objects to be registered so that appropriate observing means can benefit from the scale magnification provided intrinsically by the features. This scale magnification permits a reduction in the cost and/or complexity of the observing means. For example, in the case of measuring paste mis-registration described above, unaided human vision can successfully serve as the observing means without requiring magnification or machine vision systems.

The present invention has different aspects that contribute to achieving the above-mentioned objectives. In a first aspect, the invention is a method of fabricating layered circuit structures using an alignment vernier pattern. The method includes the steps of (i) forming a first layer having a first set of circuit-defining elements and a first row of alignment elements, the first-row alignment elements being of uniform width and pitch, the first layer being formed to have a marker adjacent to the first row of alignment elements to mark a predetermined location thereon; (ii) forming a second layer upon the first layer, the second layer having a second set of circuit-defining elements to cooperate with the first set of circuit-defining elements to achieve a predetermined circuit configuration therebetween, the second set of circuit-defining elements being located on the second layer such that corresponding circuit-defining elements from each of the sets are aligned with each other when the second layer has been properly registered with respect to the first layer, the second layer also having a second row of alignment elements to cooperate with the first row of alignment elements to determine the relative alignment of the first and second layers, the second-row alignment elements being of uniform pitch and width, the width of the second-row alignment elements being at least as great as the width of the spaces between the first-row alignment elements, and the pitch of the second-row alignment elements being slightly different than that of the first-row alignment elements, the second row of alignment elements being formed with respect to the second set of circuit-defining elements such that when the second layer has been properly registered with respect to the first layer, the second row of alignment elements is aligned with the first row of alignment elements such that an interference pattern of spaces created thereby is centered on the marker; and (iii) examining the interference pattern to determine the relative alignment of the first and second layers, precise alignment being indicated when the interference pattern of spaces is substantially centered on the marker, and misalignment being indicated otherwise, the amount of misalignment being equal to the product of a pitch difference and an offset number, the pitch difference being equal to the difference between the pitch of the first-row alignment elements and that of the second-row alignment elements, and the offset number being equal to the number of the first-row alignment elements by which the center of the interference pattern is separated from the marker.

It will be readily seen that this method describes the solder paste screening process if the first layer is taken to be the component-connection layer of the PC board and the second layer is taken to be the layer of solder paste that is screened thereon. Similarly, this method is beneficial for other applications where the first layer is the outermost layer of a printed wiring board and the second layer consists of soldermask pattern or conductive or nonconductive inks which could be used as circuit elements or nomenclature patterns circuit elements on thick film printed circuits. Other variations and refinements of this method are shown that contribute to the usefulness and novelty of the present invention in a wide range of applications.

This first aspect of the invention has the advantage that the interference pattern of spaces is readily apparent, and its center easy to find, so that the precise degree of misalignment can be quickly and accurately determined. It also provides magnification of the error for easier use. The alignment pattern can be used by either a human or a machine vision system with additional magnification if appropriate.

In another aspect, the invention is a method of fabricating a layered circuit structure including the steps of (i) forming a first layer having a first set of circuit-defining elements and a scale, the scale having an elongated portion extending in an X direction and equally-spaced grid marks extending from the elongated portion in a Y direction perpendicular to the X direction, a predetermined grid mark differing conspicuously from the rest so that it is readily identifiable; (ii) forming a second layer upon the first layer, the second layer having a second set of circuit-defining elements to cooperate with the first set of circuit-defining elements to achieve a predetermined circuit configuration therebetween, the second set of circuit-defining elements being located on the second layer such that corresponding circuit-defining elements from each of the sets are aligned with each other when the second layer is formed in a precisely registered position with respect to the first layer, the second layer also having a bar being located with respect to the second set of circuit-defining elements such that when the second layer has been formed in the precisely registered position, the bar is directly over the scale, forms a slight angle with respect thereto, and intersects the scale at the predetermined grid mark; and (iii) examining the superimposed bar and scale to determine the relative alignment of the first and second layers in the Y direction, precise alignment being indicated when the bar intersects the elongated portion at the predetermined grid mark, and misalignment being indicated otherwise, the amount of misalignment being equal to the product of a slope, a pitch, and an offset number, the slope being the slope of the bar relative to the elongated portion, the pitch being equal to the pitch between the grid marks, and the offset number being equal to the number of the grid marks by which the intersection of the bar and the elongated portion is separated from the predetermined grid mark.

This second aspect of the invention has the advantage that misalignment in one direction can be accurately indicated using a pattern that takes up space in the direction orthogonal to the direction of mis-registration being measured. It is therefore suitable for placement near the above-described vernier pattern, for example, to measure both X and Y misalignment without requiring that a pattern be placed along another edge of the PC board.

All these and other features and advantages of the present invention will be apparent from the detailed description below.

BRIEF DESCRIPTION OF THE DRAWINGS

Specific embodiments of the invention will be described with reference to the accompanying drawings, in which.

DETAILED DESCRIPTION

Figure 1:
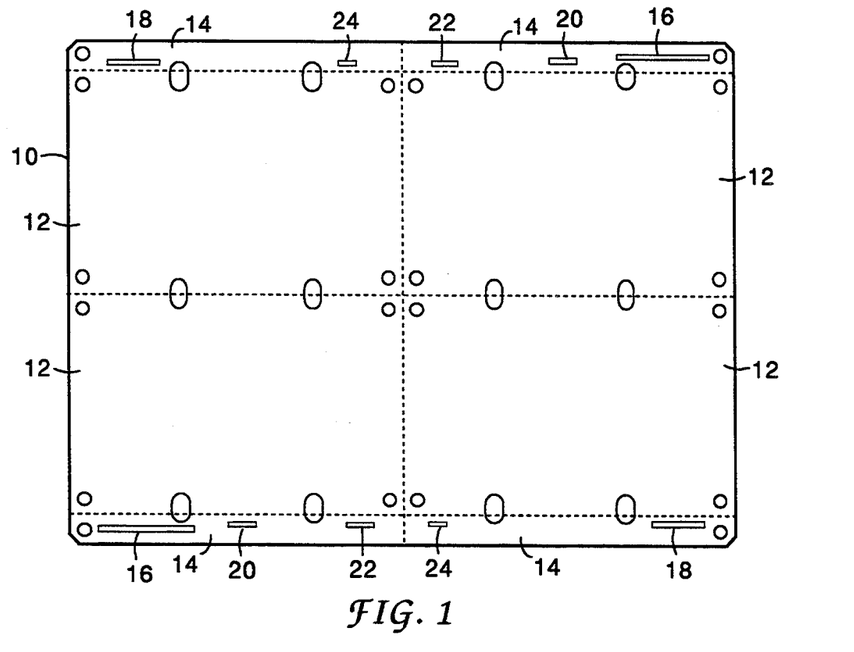
FIG. 1 is a schematic diagram of a printed circuit board incorporating the principles of the present invention.

FIG. 1 shows a printed circuit (PC) board 10 as it exists during the manufacturing process. The illustrated PC board 10 is approximately 6 by 8 inches, and actually consists of 4 identical circuit portions 12. During the manufacturing process, these circuit portions 12 are separated so that each becomes a separate finished electronic assembly. Although they are not shown in FIG. 1, it is to be understood that each circuit portion 12 has a number of component-connection pads to which the leads of electronic components are to be soldered during the manufacturing process. The PC board 10 also has tab portions 14 that are used only during the manufacturing process; during a later manufacturing step they are separated from the circuit portions 12 and discarded.

The tab portions 14 have several patterns of etch deposited thereon that are used for monitoring various manufacturing steps. The locations of these patterns are shown in FIG. 1, while the detailed appearance of each pattern is shown in subsequent Figures. There are (i) a first vernier alignment pattern 16; (ii) a second vernier alignment pattern 18; (iii) a bar alignment pattern 20; (iv) a solderability monitoring pattern 22; and (v) a solder stencil clog monitoring pattern 24. In the illustrated embodiment, the vernier alignment patterns 16 and 18 are used to monitor the horizontal alignment of solder paste to the PC board 10; the bar pattern 20 is used to monitor the vertical alignment of the solder paste; the solderability monitoring pattern 22 is used to monitor the quality of the solder joints formed by the soldering process; and the stencil clog monitoring pattern 24 is used to determine whether solder paste deposition is being hindered by clogging of the openings on the solder stencil.

While the locations of the monitoring patterns shown in FIG. 1 are particularly suitable for the illustrated PC board 10, it will be clear to those skilled in the art that the patterns may advantageously be placed at other locations. For example, the definitions of "horizontal" and "vertical" are arbitrary; the patterns could readily be employed at the lateral edges of the PC board 10 rather than the upper and lower edges. Alternatively, the patterns may be located on the circuit portions 12 rather than on separable portions such as tab portions 14. As noted below in reference to FIG. 14, however, the vertical alignment pattern 20 measures alignment in a direction orthogonal to its lengthwise direction, whereas the horizontal alignment pattern measures alignment in a direction parallel to its lengthwise direction. These patterns cooperate with each other and can be placed in any available space on the circuit board and measure alignment in two orthogonal directions.

It will be readily understood by those skilled in the art that the PC board 10 has associated therewith a solder stencil that is used to mask portions of the PC board 10 during a conventional manufacturing step of depositing solder paste in preparation for soldering electronic components to the PC board 10. Such a solder stencil has component-connection openings in locations corresponding to the component-connection pads on the PC board 10. The openings allow the deposition of solder paste on the connection pads, while the body of the stencil prevents such deposition elsewhere on the PC board 10. It is to this step of masked solder paste deposition that several aspects of the present invention are applied.

Figure 2:
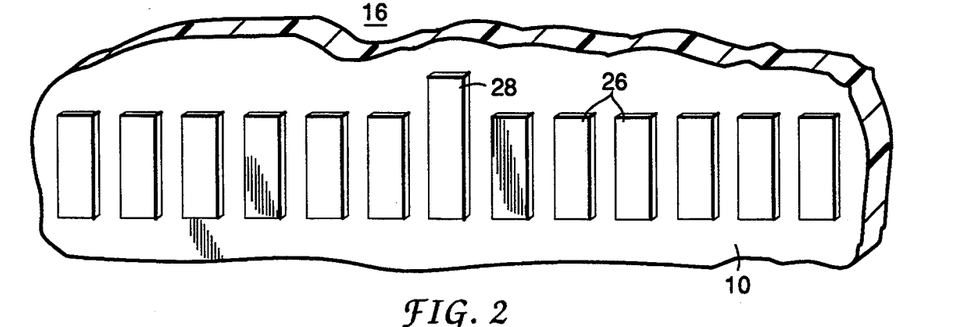
FIG. 2 shows a portion of the circuit board of FIG. 1 having a first vernier pattern of etch blocks used for monitoring solder paste alignment.

FIG. 2 shows the first vernier alignment pattern 16 on the PC board 10. The pattern consists of a row of several rectangular etch blocks 26 of equal spacing and equal height except for a centermost etch block 28. The centermost etch block 28 serves as a marker indicating a predetermined location on the board 10. In the illustrated embodiment, the etch blocks 26 are 16 mils wide and 40 mils high, except that the centermost etch block 28 is 60 mils high. The pitch of the etch blocks 26 is 24 mils, so that the spaces between them are 8 mils wide. Overall, the pattern occupies a 60×300 mil region on the PC board 10.

Figure 3:
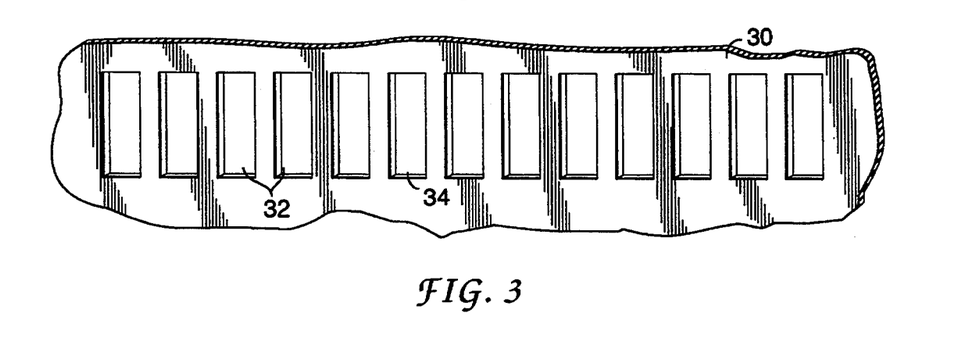
FIG. 3 shows a portion of a solder stencil having openings for forming a pattern of solder paste blocks to be used with the pattern of FIG. 2 for monitoring solder paste alignment.

FIG. 3 shows a portion of a solder stencil 30 having a first vernier pattern of rectangular openings 32, including a centermost opening 34, that are used in conjunction with the first vernier etch block pattern 16. The openings 32 are 40 mils high and 14 mils wide, and have a pitch of 22 mils. The openings 32 are located on the solder stencil 30 such that when it is placed on the PC board 10 in a precisely registered position, the row of openings 32 is superimposed on the etch block pattern 16, and the centermost opening 34 is directly aligned with the centermost etch block 28. When the solder stencil 30 is in this precisely registered position, its component-connection openings are also precisely aligned with their corresponding component-connection pads on the PC board 10.

During the solder paste deposition process, the solder stencil 30 is placed on the PC board 10 in the neighborhood of the above-mentioned precisely registered position, being perhaps slightly misaligned therefrom. After this placement of the solder stencil 30, solder paste is deposited in a conventional fashion, resulting in a row of solder paste blocks being deposited through the openings 32 in the solder stencil 30. An operator then observes the relative position of the solder paste blocks and the etch blocks 26 to detect and measure misalignment.

The difference between the pitch of the openings 32 and the etch blocks 26 is exploited to measure the amount of misalignment. The pitch difference gives rise to an interference pattern of spaces, the center of which is separated from the centermost etch block 28 by some generally non-integral number of etch blocks 26. The amount of misalignment is the product of this number of separating etch blocks 26 and the pitch difference. In the illustrated embodiment, this pitch difference is 2 mils, so the amount of misalignment is 2 mils per etch block.

The misalignment measurement so taken may be used in any of the previously-mentioned registration processes, such as calibration, active registration control, and process monitoring. In the calibration case, for example, the measurements are used to compute new offset control values for the stencil equipment during a subsequent manufacturing run.

In contrast to prior vernier patterns, a pattern according to the present invention provides robust visual assistance in gauging misalignment. This visual assistance takes the form of a distinct pattern of spaces, wherein the spaces are widest in the center of the pattern and get increasingly narrower toward the sides. This pattern helps to quickly draw the eye to a particular etch block 26 upon which the pattern is centered. It is then a simple matter to determine how far away this etch block is from the centermost etch block 28.

The interference pattern of spaces is formed by the overlapping sets of spaces between the solder paste blocks 40 and spaces between the etch blocks 26. While this pattern may be created by many configurations of the etch blocks 26 and solder paste blocks 40, there are a few general guidelines. To begin with, the solder paste blocks 40 must be at least as wide as the spaces between the etch blocks 26, so that the spaces outside the pattern of spaces can be occluded. It is also desirable that the width of the solder paste blocks 40 be no greater than the width of the etch blocks 26, to help in identifying the center of the interference pattern; if the solder paste blocks 40 were wider than the etch blocks 26, the etch blocks 26 near the center of the pattern would be covered, making it more difficult to ascertain the exact position. The patterns of etch blocks 26 and solder paste blocks 40 should also be wide enough so that a pattern of spaces appears over the expected range of misalignment; however, if the patterns are too wide, multiple patterns of spaces may be created, with resulting ambiguity.

Figure 4:
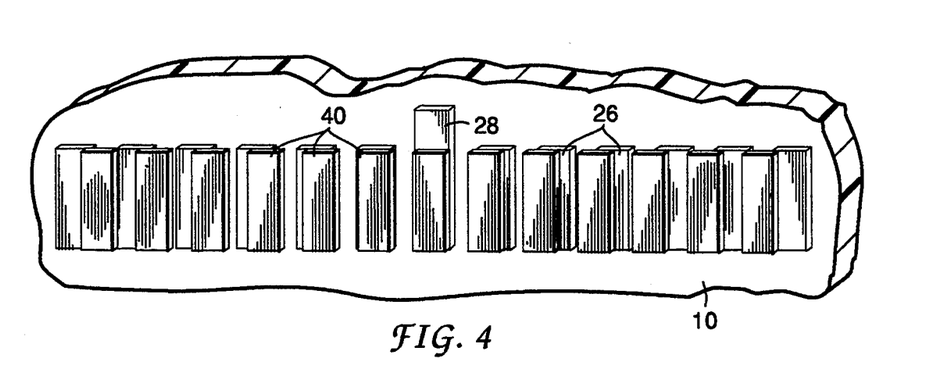
FIG. 4 shows the circuit board of FIG. 2 with a pattern of solder paste blocks deposited thereon when the solder paste is correctly registered with the circuit board.
Figure 5:
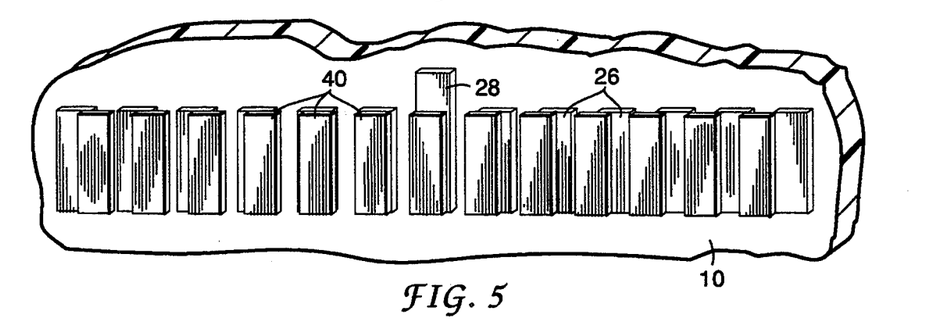
FIG. 5 shows the circuit board of FIG. 2 with a pattern of solder paste blocks deposited thereon when the solder paste is shifted left by one unit of pitch difference with respect to the circuit board, where "pitch difference" is the difference between the pitch of the etch blocks of FIG. 2 and that of the solder stencil openings of FIG. 3.
Figure 6:
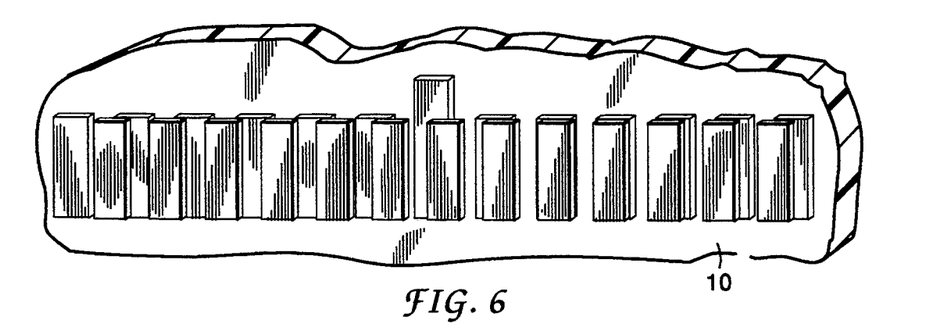
FIG. 6 shows the circuit board of FIG. 2 with a pattern of solder paste blocks deposited thereon when the solder paste is shifted right by two and one-half units of pitch difference with respect to the circuit board.
Figure 7:
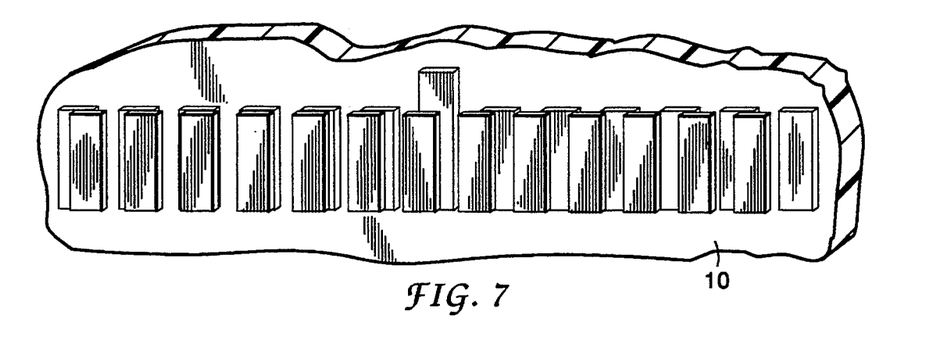
FIG. 7 shows the circuit board of FIG. 2 with a pattern of solder paste blocks deposited thereon when the solder paste is shifted left by four units of pitch difference mils with respect to the circuit board.
Figure 8:
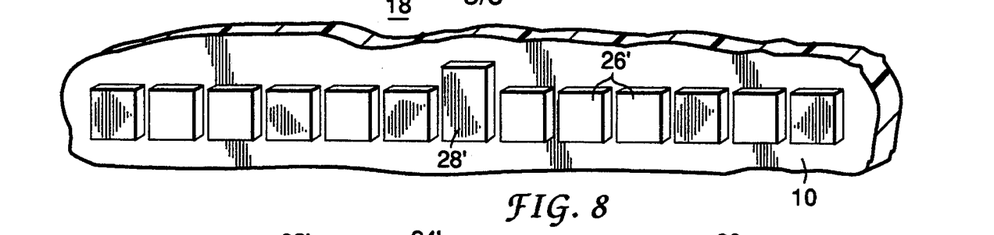
FIG. 8 shows another portion of the circuit board of FIG. 1 having a second vernier pattern of etch blocks used for monitoring solder paste alignment wherein the etch blocks are significantly wider than the spaces separating the etch blocks.
Figure 9:
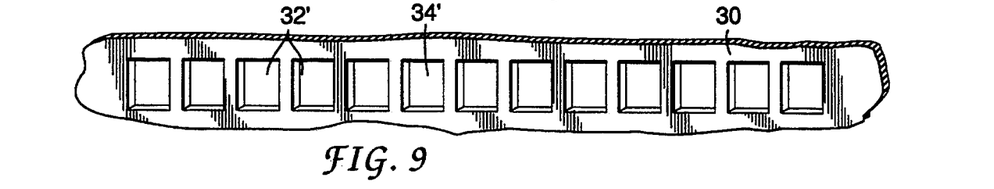
FIG. 9 shows a portion of a solder stencil having openings for forming a pattern of solder paste blocks to be used with the pattern of FIG. 8 for monitoring solder paste alignment.
Figure 10:
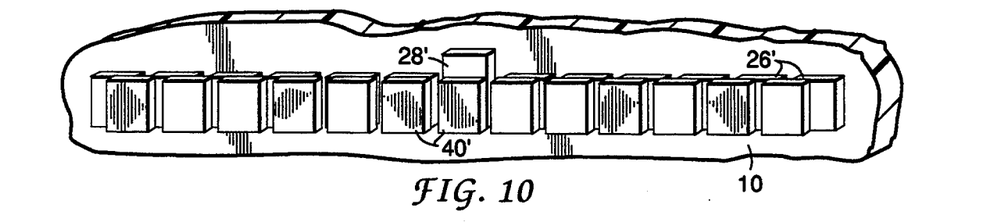
FIG. 10 shows the circuit board of FIG. 8 with a pattern of solder paste blocks deposited thereon when the solder paste is correctly aligned with the circuit board.
Figure 11:
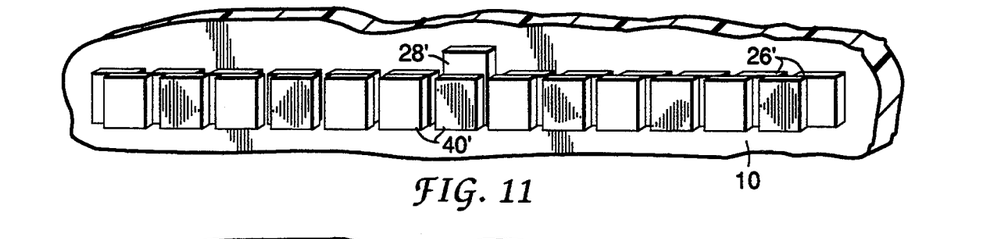
FIG. 11 shows the circuit board of FIG. 8 with a pattern of solder paste blocks deposited thereon when the solder paste is shifted left by one unit of pitch difference with respect to the circuit board, where "pitch difference" is the difference between the pitch of the etch blocks of FIG. 8 and that of the solder stencil openings of FIG. 9.
Figure 12:
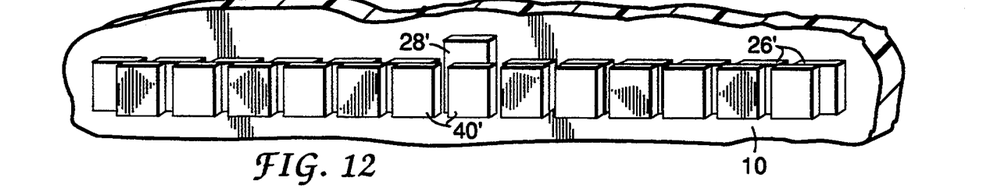
FIG. 12 shows the circuit board of FIG. 8 with a pattern of solder paste blocks deposited thereon when the solder paste is shifted right by two and one-half units of pitch difference with respect to the circuit board.
Figure 13:
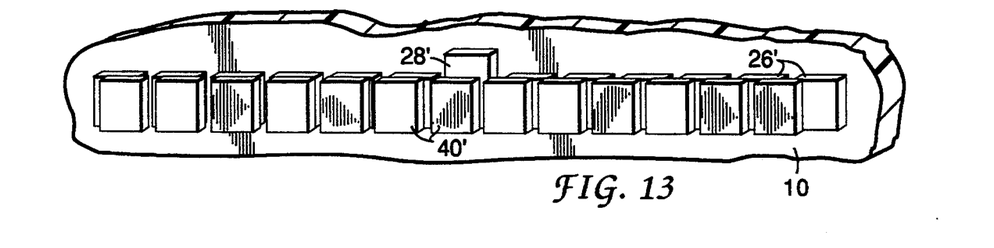
FIG. 13 shows the circuit board of FIG. 8 with a pattern of solder paste blocks deposited thereon when the solder paste is shifted left by four units of pitch difference with respect to the circuit board.

Examples of the results of solder paste deposition are shown in FIGS. 4 through 7, which show the solder paste blocks 40 superimposed on the etch blocks 26. FIG. 4 shows the result when there is no misalignment; FIG. 5 shows the result when the solder stencil 30 is shifted left by 2 mils; FIG. 6 shows the result when the solder stencil 30 is shifted right by 5 mils; and FIG. 7 shows the result when the solder stencil 30 is shifted left by 8 mils. In each of these figures, the location of the center of the interference pattern relative to the centermost etch block 26 is readily apparent. Once the center of the interference pattern has been found, it is a simple matter to count the number of etch blocks 26 to the centermost one 28, and to multiply this number by 2 mils to determine the amount of misalignment. A skilled user can also interpolate between etch blocks 26 for a finer measurement.

FIGS. 8 through 13 show a second vernier pattern similar to the one described above. In this second pattern, the etch blocks 26' are 40 mils wide and 40 mils high, and the centermost etch block 28' is 60 mils high. The pitch of the etch blocks 26' is 48 mils, so that the spaces between them are 8 mils wide. Overall, the pattern occupies a 60×600 mil region on the PC board 10. On the solder stencil 30, the openings 32' are 40 mils high and 36 mils wide, and have a pitch of 46 mils. It will be noted that the pattern of spaces is not quite as well defined as in the first pattern. This is because the spaces themselves are smaller in comparison to the widths of the etch blocks 26' and solder paste blocks 40'.

While the vernier patterns shown in FIGS. 2 through 13 employ rectangular pads, it is an advantage of the present invention that their shape is not as critical as in prior patterns. This is because patterns according to the present invention create an easily-discerned visual interference pattern of spaces, in contrast to prior patterns that relied on the detection of aligned edges of pattern elements. Therefore, patterns in accordance with the present invention may actually be oval or other non-rectangular shapes in alternative embodiments. Such patterns, however, may confound mis-registration effects in the two orthogonal axes, and for that reason the rectangular shape is preferred.

Another property of the vernier pattern of the present invention is apparent upon examination of FIGS. 2 through 13, namely that the nature of the interference pattern can be changed by altering the width and spacing of the pads 26 and/or solder blocks 40. Wider pads produce an effect in which the light portion of the interference pattern appears narrower than for narrower pads. The center of the light portion of the interference pattern acts as a pointer to the offset point. Wider pads produce a sharper pointer, albeit at the cost of dimming it somewhat; narrower pads have the opposite effect. This property can be exploited in practice to yield an optimum balance between sharpness of the pointer and overall brightness.

FIGS. 14 through 19 show an embodiment of another aspect of the present invention, namely the bar alignment pattern 20 of FIG. 1. This pattern acts to translate misalignment in one direction to a measurement in the orthogonal direction. This feature is especially useful in applications such as that shown in FIG. 1, where only one edge is used to monitor misalignment both parallel to and orthogonal to that edge. A scale 50 on the PC board 10 has upper and lower grid marks 52. Taller grid marks 54, including centermost grid mark 55, are placed at regular intervals as an aid in reading the scale. In the illustrated embodiment, both sets of upper and lower grid marks 52 have 23 mil spacing, and are offset from each other by 11.5 mils. The grid marks 52 are 15 mils high, except for the taller marks 54 which are 22 mils high, and mark 55 which is 27 mils high. The etch width is 5 mils. The scale 50 occupies a 55×300 mil area on the PC board 10.

Figure 16:
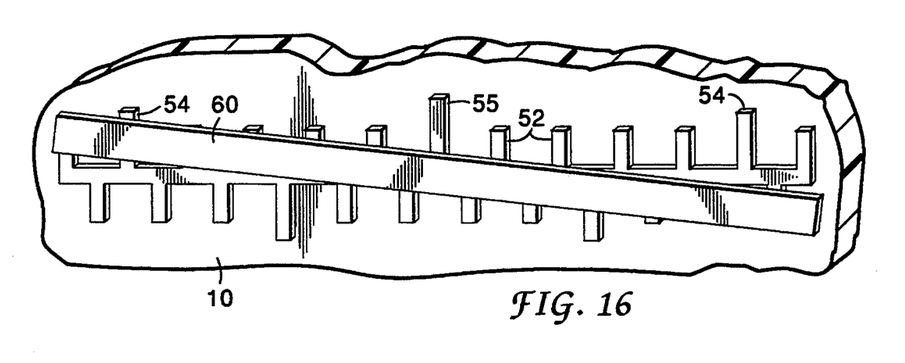
FIG. 16 shows the circuit board of FIG. 14 with a bar of solder paste deposited thereon when the solder paste is precisely aligned with the circuit board.
Figure 17:
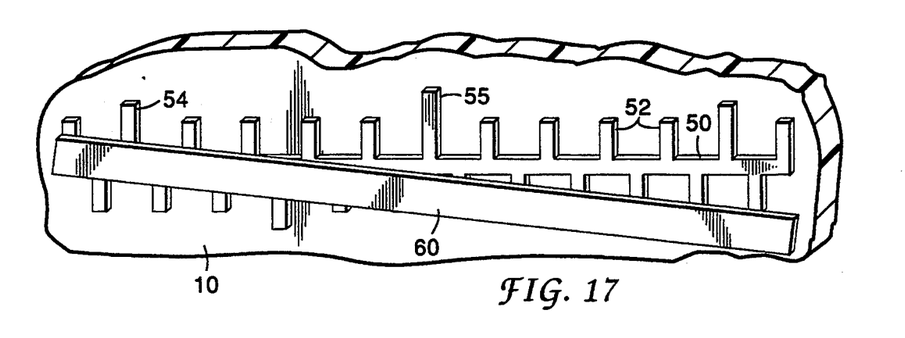
FIG. 17 shows the circuit board of FIG. 14 with a bar of solder paste deposited thereon when the solder paste is shifted down 5 vertical units with respect to the circuit board, where each vertical unit is the product of the spacing between the grid marks in the scale of FIG. 14 and the slope of the bar-shaped opening of FIG. 15.
Figure 18:
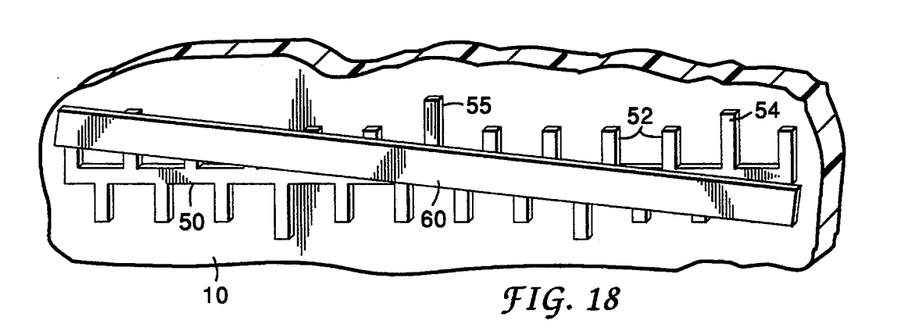
FIG. 18 shows the circuit board of FIG. 14 with a bar of solder paste deposited thereon when the solder paste is shifted up two and one-half vertical units with respect to the circuit board.
Figure 19:
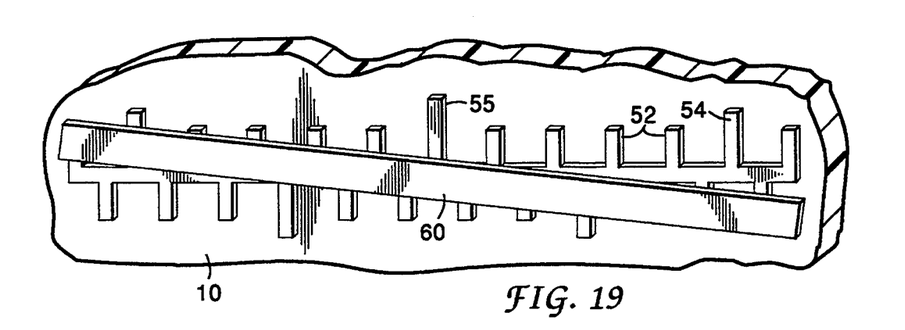
FIG. 19 shows the circuit board of FIG. 14 with a bar of solder paste deposited thereon when the solder paste is shifted down one-half vertical unit with respect to the circuit board.

The scale 50 is used in conjunction with a bar of solder paste 60 that is formed by a bar-shaped opening 62 in the solder stencil 30. In the illustrated embodiment, the opening 62 is 12 mils wide and 285 mils long, and forms a 5 degree angle with respect to the horizontal portion of the scale 50. The solder paste bar 60 nominally intersects the scale 50 near the centermost grid 55, as is shown in FIG. 16. The 5 degree slope of the opening 62 combined with the 23 mil spacing of the grid marks 52 yields a y-direction or vertical misalignment indication of 2 mils per grid mark. This is illustrated in the exemplary diagrams of FIG. 17, in which the solder stencil is shifted down by 10 mils; FIG. 18, in which the solder stencil is shifted up by 5 mils; and FIG. 19, in which the solder stencil is shifted down by 1 mil.

Figure 14:
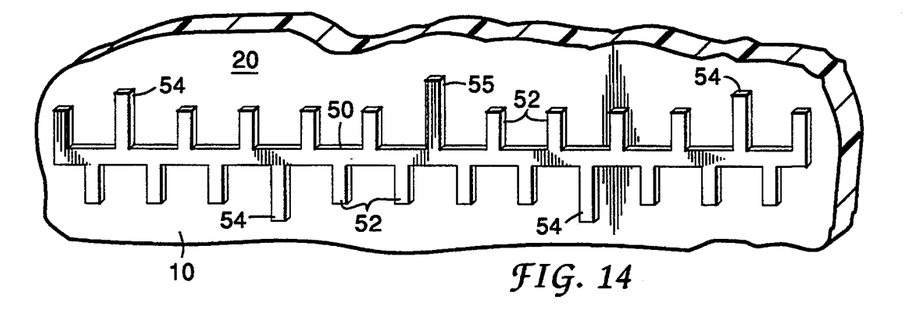
FIG. 14 shows another portion of the circuit board of FIG. 1 having a scale pattern of etch used for monitoring solder paste alignment.
Figure 15:
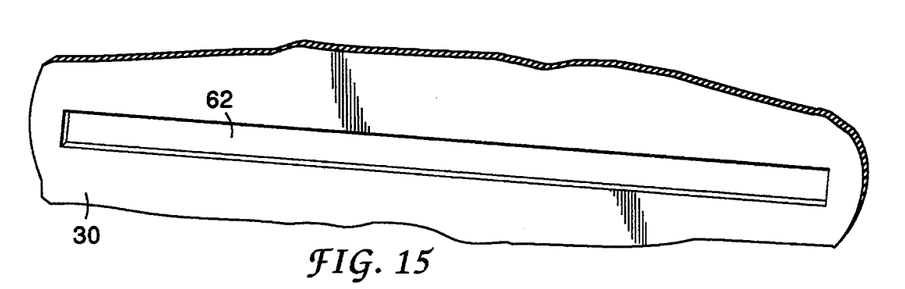
FIG. 15 shows a portion of a solder stencil having a bar-shaped opening for forming a bar of solder paste to be used with the pattern of FIG. 14 for monitoring solder paste alignment.

The bar alignment pattern 20, then, indicates misalignment by a combination of the relative slope between the scale 50 and the solder paste bar 60, and the spacing between the grid marks 52. It advantageously translates misalignment in one direction into a measurement in the perpendicular direction.

What has been described is a set of embedded features to assist in accurate measurement of alignment in support of calibration, monitoring and control of assembly processes for electronic components onto substrates such as printed circuit boards. While these features in all their detail embody the present invention, other embodiments exist as well that are intended to be described by the following claims.

What is claimed is:

1. A method of fabricating a layered circuit structure, comprising the steps of:

forming a first layer having a first set of circuit-defining elements and a first row of alignment elements, said first-row alignment elements being of uniform width and pitch, said first layer being formed to have a marker adjacent to said first row of alignment elements to mark a predetermined location thereon;

forming a second layer upon said first layer, said second layer having a second set of circuit-defining elements to cooperate with said first set of circuit-defining elements to achieve a predetermined circuit configuration therebetween, said second set of circuit-defining elements being located on said second layer such that corresponding circuit-defining elements from each of said sets are aligned with each other when said second layer has been properly registered with respect to said first layer, said second layer also having a second row of alignment elements to cooperate with said first row of alignment elements to determine the relative alignment of said first and second layers, said second-row alignment elements being of uniform pitch and width, the width of said second-row alignment elements being at least as great as the width of the spaces between said first-row alignment elements, and the pitch of said second-row alignment elements being slightly different than that of said first-row alignment elements, said second row of alignment elements being formed with respect to said second set of circuit-defining elements such that when said second layer has been properly registered with respect to said first layer, said second row of alignment elements is aligned with said first row of alignment elements such that an interference pattern of spaces created thereby is centered on said marker; and examining said interference pattern to determine the relative alignment of said first and second layers, precise alignment being indicated when said interference pattern of spaces is substantially centered on said marker, and misalignment being indicated otherwise, the amount of misalignment being equal to the product of a pitch difference and an offset number, said pitch difference being equal to the difference between the pitch of said first-row alignment elements and that of said second-row alignment elements, and said offset number being equal to the number of said first-row alignment elements by which the center of said interference pattern is separated from said marker.

2. A method according to claim 1, wherein said second-row alignment elements are formed to be narrower than said first-row alignment elements.

3. A method according to claim 1, wherein said marker is a portion of a predetermined one of said first-row alignment elements that differs conspicuously from the rest so that it is readily identifiable.

4. A method according to claim 3, wherein said predetermined first-row alignment element is higher than the rest of said first-row alignment elements, and said marker is the uppermost portion thereof.

5. A method according to claim 3, wherein said predetermined first-row alignment element is the centermost one of said first-row alignment elements.

6. A method according to claim 1, wherein said alignment elements are dimensioned to be easily visible with a magnifying glass, and wherein said inspecting step comprises the step of examining said circuit structure with said magnifying glass.

7. A method according to claim 6, wherein said circuit structure is a printed circuit board.

8. A method according to claim 1, wherein said alignment elements are dimensioned to be easily visible with a microscope, and wherein said inspecting step comprises the step of examining said circuit structure with said microscope.

9. A method according to claim 1, wherein said first-row alignment elements and said second-row alignment elements are rectangular.

10. A method according to claim 9, wherein each of said first-row alignment elements measures 16 mils wide by 40 mils high except for said predetermined one which measures 16 mils wide by 60 mils high, and wherein the pitch of said first-row alignment elements is 24 mils, and wherein each of said second-row alignment elements measures 14 mils wide by 40 mils high, and wherein the pitch of said second-row alignment elements is 22 mils.

11. A method according to claim 1, wherein said first layer is a component-connection layer of a printed circuit board, said first set of circuit-defining elements is a set of circuit-defining contact pads, said first row of alignment elements is a row of alignment contact pads, said second set of circuit-defining elements is a set of circuit-defining solder blocks to be deposited on said component-connection layer, and said second row of alignment elements is a row of alignment solder blocks to be deposited on said component-connection layer, and wherein said step of forming said second layer comprises the steps of:

forming circuit-defining openings and a row of alignment openings in a solder stencil associated with said circuit structure, said circuit-defining openings being located on said solder stencil such that each defines an area on said component-connection layer where a corresponding one of said circuit-defining solder blocks will be located when said second layer has been properly registered with respect to said first layer, and said row of alignment openings being located such that each defines an area on said component-connection layer where a corresponding one of said alignment solder blocks will be located when said second layer has been properly registered with respect to said first layer;

placing said solder stencil over said component-connection layer such that each of said circuit-defining openings is substantially aligned with a corresponding one of said circuit-defining contact pads; and depositing solder paste onto said component-connection layer through the openings in said solder stencil to create said circuit-defining solder blocks and said alignment solder blocks.

12. A method according to claim 1, wherein said first layer is a component-connection layer of a printed circuit board, said first set of circuit-defining elements is a set of circuit-defining contact pads, said first row of alignment elements is a row of alignment contact pads, said second set of circuit-defining elements is a set of thick-film circuit elements to be deposited on said component-connection layer, and said second row of alignment elements is a row of thick-film alignment blocks to be deposited on said component-connection layer, and wherein said step of forming said second layer comprises the steps of:

forming circuit-defining openings and a row of alignment openings in a stencil associated with said circuit structure, said circuit-defining openings being located on said stencil such that each defines an area on said component-connection layer where a corresponding one of said thick-film circuit elements will be located when said second layer has been properly registered with respect to said first layer, and said row of alignment openings being located such that each defines an area on said component-connection layer where a corresponding one of said thick-film alignment blocks will be located when said second layer has been properly registered with respect to said first layer;

placing said stencil over said component-connection layer such that each of said circuit-defining openings is substantially aligned with a corresponding pair of said circuit-defining contact pads; and depositing thick-film material onto said component-connection layer through said openings in said stencil to create said thick-film circuit elements and said thick-film alignment blocks.

13. A method according to claim 12, wherein said thick-film circuit elements are selected from the group consisting of conductors, insulators, and resistors.

14. A method according to claim 1, further comprising the step of adjusting a machine used to form said second layer by an amount corresponding to the measured misalignment to reduce misalignment between said first and second layers for subsequently-fabricated layered circuit structures.

15. A method according to claim 1, wherein said layered circuit structure is a printed wiring board.

16. A method according to claim 1, wherein said layered circuit structure is a hybrid circuit.

17. A method according to claim 1, wherein said layered circuit structure is a flexible circuit.

18. A method according to claim 1, wherein said layered circuit structure is a thick-film circuit.

19. A method according to claim 1, wherein said layered circuit structure is a semiconductor wafer.

20. A method of fabricating an electronics assembly, comprising the steps of:

forming a row of alignment pads upon a surface of a printed circuit board having component connection pads to which the leads of electronic circuit components are to be connected, said alignment pads being of uniform width and pitch and also being of a uniform height except for a centermost alignment pad of conspicuously greater height;

forming a row of alignment openings upon a solder stencil associated with said electronics assembly, said solder stencil also having component connection openings corresponding to said component connection pads on said printed circuit board, said alignment openings being of uniform width and pitch and also being of a uniform height substantially equal to the height of said alignment pads except for said centermost alignment pad, the width of said alignment openings being at least as great as the width of the spaces between said alignment pads, and the pitch of said alignment openings being slightly different than that of said alignment pads, said row of alignment openings being located on said solder stencil such that when said solder stencil has been properly registered with respect to said surface of said printed circuit board so that said component connection openings are aligned with corresponding ones of said component connection pads, a row of alignment solder blocks subsequently deposited therethrough is aligned with said row of alignment pads such that a interference pattern of spaces created thereby is centered on said centermost alignment pad;

placing said solder stencil on said surface of said printed circuit board;

depositing solder paste on said printed circuit board through said solder stencil, thereby forming component connection solder blocks through said component connection openings, and also forming alignment solder blocks through said alignment openings;

removing said solder stencil from said printed circuit board; and inspecting the alignment of said alignment solder blocks and said alignment pads, precise alignment being indicated when said interference pattern of spaces is substantially centered on said centermost alignment pad, and misalignment being indicated otherwise, the amount of misalignment being equal to the product of a pitch difference and an offset number, said pitch difference being equal to the difference between the pitch of said alignment pads and that of said alignment openings, and said offset number being equal to the number of said alignment pads by which the center of said interference pattern is separated from said centermost alignment pad.

21. A method of fabricating a layered circuit structure, comprising the steps of:

forming a first layer having a first set of circuit-defining elements and a scale, said scale having an elongated portion extending in an X direction and equally-spaced grid marks extending from said elongated portion in a Y direction perpendicular to said X direction, a predetermined grid mark differing conspicuously from the rest so that it is readily identifiable;

forming a second layer upon said first layer, said second layer having a second set of circuit-defining elements to cooperate with said first set of circuit-defining elements to achieve a predetermined circuit configuration therebetween, said second set of circuit-defining elements being located on said second layer such that corresponding circuit-defining elements from each of said sets are aligned with each other when said second layer has been properly registered with respect to said first layer, said second layer also having a bar being located with respect to said second set of circuit-defining elements such that when said second layer has been properly registered with respect to said first layer, said bar is directly over said scale, forms a slight angle with respect thereto, and intersects said scale at said predetermined grid mark; and examining the superimposed bar and scale to determine the relative alignment of said first and second layers in said Y direction, precise alignment being indicated when said bar intersects said elongated portion at said predetermined grid mark, and misalignment being indicated otherwise, the amount of misalignment being equal to the product of a slope, a pitch, and an offset number, said slope being the slope of said bar relative to said elongated portion, said pitch being equal to the pitch between said grid marks, and said offset number being equal to the number of said grid marks by which the intersection of said bar and said elongated portion is separated from said predetermined grid mark.

22. A method of fabricating an electronics assembly, comprising the steps of:

forming a scale on a component-connection layer of a printed circuit board, said component-connection layer having component connection pads thereon, said scale having a long etch extending in an X direction and equally-spaced grid marks extending from said long etch in a Y direction perpendicular to said X direction, a centermost grid mark being of conspicuously different height than neighboring grid marks thereby being readily identifiable;

forming a bar-shaped alignment opening in a solder stencil associated with said electronics assembly, said solder stencil having component connection openings corresponding to said component connection pads on said printed circuit board, said alignment opening being located on said solder stencil such that when said solder stencil has been properly registered with respect to said component-connection layer of said printed circuit board so that said component connection openings are directly over corresponding ones of said component connection pads, said alignment opening is directly over said scale, forms a slight angle with respect to said long etch, and intersects said long etch at said centermost grid mark;

placing said solder stencil on said surface of said printed circuit board;

depositing solder paste on said printed circuit board through said solder stencil, thereby forming an alignment solder bar through said alignment opening;

removing said solder stencil from said printed circuit board; and inspecting the alignment of said solder bar with said scale in said Y direction, precise alignment being indicated when said solder bar intersects said long etch at said centermost grid mark, and misalignment being indicated otherwise, the amount of misalignment being equal to the product of a slope, a pitch, and an offset number, said slope being the slope of said solder bar relative to said long etch, said pitch being equal to the pitch between said grid marks, and said offset number being equal to the number of said grid marks by which the intersection of said solder bar and said long etch is separated from said centermost grid mark.

* * * * *